June 17, 1969 J. C. G. DAWNAY ET AL 3,451,002
CASCODE-CONNECTED TRANSISTOR AMPLIFIERS
Filed July 14, 1967
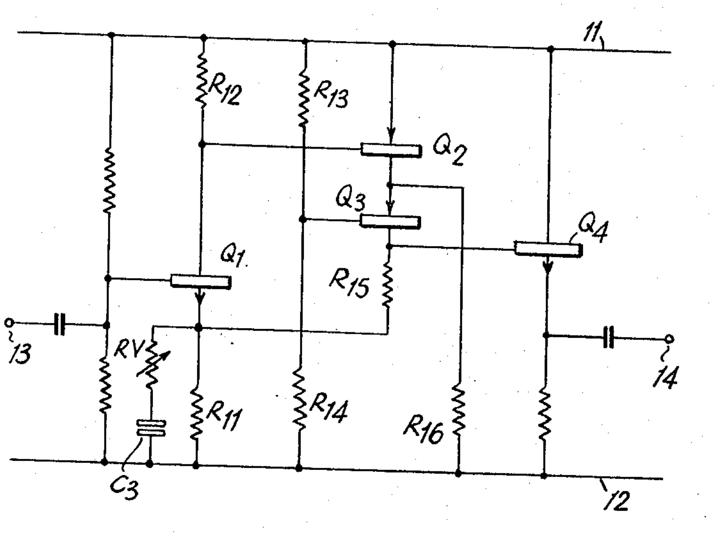

United States Patent Office 3,451,002
Patented June 17, 1969

3,451,002
CASCODE-CONNECTED TRANSISTOR AMPLIFIERS

John Christian George Dawnay, Wykeham Abbey, Scarborough, Wykeham, England, and Eric Andrew Faulkner, 31 Bulmershe Road, Reading, England Filed July 14, 1967, Ser. No. 653,380
Claims priority, application Great Britain, July 18, 1966, 32,132/66; Oct. 18, 1966, 46,493/66
Int. Cl. H03f *3/68, 1/08, 1/34*
U.S. Cl. 330—20 5 Claims

ABSTRACT OF THE DISCLOSURE

A transistor amplifier circuit has a stage comprising a cascoded pair of transistor preceded by a stage constituted by a transistor of complementary type to the cascoded pair. Current through the common emitter transistor of the cascoded pair is augmented by a resistor connected across the common base transistor and a feedback path is provided from the collector electrode of the common base transistor to the emitter electrode of the complementary transistor as by providing for the emitter load of the complementary transistor to form part of the collector load of the common base transistor.

This invention relates to electronic amplifiers and more particularly to cascode-connected amplifiers.

The cascode-connected amplifier comprises a pair of transistors connected in series one of the transistors of the pair being connected in common emitter configuration and the other transistor of the pair being connected in common base configuration. The input to the amplifier is applied to the base of the common emitter transistor and the output is taken from the collector load of the common base transistor.

According to the invention a transistor amplifier circuit comprises a cascode-connected stage and a preceding stage comprising a transistor of complementary type to the cascode-connected transistors, the complementary transistor having both an emitter load and a collector load, and a feedback path from the collector electrode of the common base transistor of the cascoded pair to the emitter load of the complementary transistor.

In carrying out the invention a current path may be provided across the common base transistor to augment the current through the common emitter transistor.

The feedback path may be constitued by the emitter load of the complementary transistor forming part of the collector load of the common base transistor.

In order that the invention may be more fully understood reference will now be made to the accompanying drawings. The figure thereof illustrates a circuit diagram embodying the invention.

Referring to the figure there is shown therein an amplifier circuit including a stage constituted by a pair of pnp transistors Q2 and Q3 connected in cascode between supply lines 11 and 12. The emitter electrode of the common emitter transistor Q2 is directly connected to supply line 11 and the collector load of the common base transistor Q3 comprising resistors R15 and R11 is connected to supply line 12. The base electrode of transistor Q3 is connected to a potential divider chain formed by resistors R13 and R14 connected between the supply lines 11 and 12. The input to the cascode-connected stage is applied to the base electrode of transistor Q2 and the output from this stage is taken from the collector electrode of transistor Q3 to an emitter follower stage comprising a npn transistor Q4 the emitter electrode of which is coupled to output terminal 14 of the circuit. A resistor R16 is connected between the collector electrode of transistor Q2 and supply line 12 and augments the current through transistor Q2 in comparison with the current through transistor Q3.

The cascode stage of the amplifier is preceded by a stage including a npn transistor Q1 having both a collector load R12 and an emitter load R11 which also constitutes part of the collector load of transistor Q3. Resistor R11 is shunted by a variable resistor RV and a capacitor C3 for the purposes of gain control and the input to the circuit at an input terminal 13 is coupled to the base electrode of the transistor Q1.

In operation of the circuit illustrated in the figure a signal applied at terminal 13 is amplified in the first stage of the amplifier and then applied to the second stage of the amplifier comprising the cascoded pair of transistor Q2 and Q3. Due to the fact that resistor R11 is common to both the first and second stages, feedback occurs and the current through transistor Q3 is stabilised thereby. Thus, if for any reason the current through transistor Q3 tends to increase, the potential across resistor R11 will increase correspondingly causing a reduction in current through transistor Q1 and hence a reduction in potential across resistor R12. This, in turn, will reduce the current through transistor Q2 to tend to reduce the current through transistor Q3 and thereby achieve stabilisation thereof.

The amount of gain depends on the value of resistance common to both stages and components RV and C3 provide for variable gain control without affecting the D.C. levels in the circuit. If a fixed value of gain is desired, then, of course, variable resistor RV can be replaced by a fixed value resistor.

Since all the couplings through the amplifier are direct, the amplifier can have a very wide bandwidth. Furthermore, the amplifier despite the high level of gain in the circuit remains stable at all its operating frequencies with a very high degree of feedback. Another advantage is that the circuit inherently has no noise and any variation of the gain control RV attenuates both signal and noise together so that any reduction of gain does not introduce a proportionate increase in noise.

Circuits embodying the invention have increased gain and a reduction in non-linearity compared with conventional cascode amplifiers.

We claim:

1. A cascode-connected transistor amplifier circuit arrangement comprising a plurality of stages, said plurality of stages comprising a first stage comprising first and second transistors of similar type connected in cascode, said first transistor being connected in a common base configuration, and a second stage preceding said cascode stage comprising a transistor of a complementary type to said first and second cascoded transistors, said complementary transistor having both an emitter load and a collector load; and a feedback path from the collector electrode of the common base transistor of the cascoded transistors to said emitter load of the complementary transistor.

2. The circuit arrangement according to claim 1 wherein said second transistor is connected in a common emitter configuration, said arrangement further comprising a current path across the common base transistor of the cascoded transistors for augmenting the current through the common emitter transistor of the cascoded transistors.

3. The circuit arrangement according to claim 1 wherein said feedback path is constituted by said emitter load of the complementary transistor forming part of the collector load of the common base transistor of the cascoded transistors.

4. The circuit arrangement according to claim 1 further comprising gain control means for varying the magnitude of said emitter load.

5. The circuit arrangement according to claim 4 in which said gain control comprises a variable resistor in series with a capacitor whereby gain control can be effected without change in D.C. level.

References Cited

UNITED STATES PATENTS

| | | | |
|---|---|---|---|
| 3,075,151 | 1/1963 | Murray | 330—25 X |
| 3,210,683 | 10/1965 | Pay. | |
| 3,368,156 | 2/1968 | Kam | 330—20 X |

FOREIGN PATENTS

| | | |
|---|---|---|
| 974,105 | 11/1964 | Great Britain. |
| 982,129 | 2/1965 | Great Britain. |
| 1,006,148 | 9/1965 | Great Britain. |

ROY LAKE, *Primary Examiner.*

J. B. MULLINS, *Assistant Examiner.*

U.S. Cl. X.R.

330—28, 29